US009494736B2

(12) United States Patent
Rong et al.

(10) Patent No.: US 9,494,736 B2
(45) Date of Patent: Nov. 15, 2016

(54) TECHNOLOGIES FOR GENERATING A BROADBAND OPTICAL OUTPUT

(71) Applicant: Intel Corporation, Santa Clara, CA (US)

(72) Inventors: Haisheng Rong, Pleasanton, CA (US); Shengbo Xu, Santa Clara, CA (US); Jonathan K. Doylend, Morgan Hill, CA (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 14/318,139

(22) Filed: Jun. 27, 2014

(65) Prior Publication Data

US 2015/0378099 A1 Dec. 31, 2015

(51) Int. Cl.
*G02B 6/12* (2006.01)
*G02B 6/122* (2006.01)
*G02B 6/293* (2006.01)

(52) U.S. Cl.
CPC ......... *G02B 6/12016* (2013.01); *G02B 6/1225* (2013.01); *G02B 6/2938* (2013.01); *G02B 2006/12104* (2013.01); *G02B 2006/12107* (2013.01)

(58) Field of Classification Search
CPC .............. G02B 6/12007; G02B 6/1225; G02B 6/0068;G02B 26/08; G02B 26/0833; G02B 26/085; B82Y 20/00
See application file for complete search history.

(56) References Cited

U.S. PATENT DOCUMENTS

| 2003/0193937 A1* | 10/2003 | Beshai | H04Q 11/0005 370/372 |
| 2011/0234435 A1* | 9/2011 | Woodward | H03M 1/124 341/137 |
| 2012/0237155 A1* | 9/2012 | Zheng | G02B 6/12007 385/2 |

\* cited by examiner

*Primary Examiner* — Thomas A Hollweg
*Assistant Examiner* — Mary A El Shammaa
(74) *Attorney, Agent, or Firm* — Barnes & Thornburg LLP

(57) ABSTRACT

Technologies for generating a broadband optical output include a plurality of narrowband optical sources formed in a silicon substrate to generate a narrowband optical output, a plurality of input optical waveguides to route the narrowband optical output, an optical multiplexer formed in the silicon substrate to reflect the routed narrowband optical output, and an output optical waveguide to collect the reflected narrowband optical output to generate the broadband optical output. The output optical waveguide may route the broadband optical output to an output of the photonic integrated circuit.

17 Claims, 5 Drawing Sheets

TECHNOLOGIES FOR GENERATING A BROADBAND OPTICAL OUTPUT

BACKGROUND

Typical broadband optical sources generate an optical output having a relatively broad spectral bandwidth and are used in a wide range of varying applications. For example, broadband optical sources find use in spectroscopy, optical coherence tomography, optical communication test and measurement, and other applications in which a broad spectrum light is required or otherwise desirable. Typical commercially available broadband optical sources are formed from an array of light emitting didoes (LEDs). In such devices, the optical output of each LED is combined using optical fiber or free-space optical components. Because the LED circuits are independent of each other and require additional alignment hardware, the overall size of a standard broadband optical source can be excessively large for some applications (e.g., a typical broadband optical source may have dimensions of tens of centimeters).

Photonic or optical integrated circuits combine multiple optical components to provide various optical functionality including, but not limited to, optical amplification, optical filtering, optical routing, and optical modulation. The optical components may include, for example, optical amplifiers, optical filters, lasers, optical detectors, and waveguides for routing optical signals. Photonic integrated circuits may be formed using a variety of materials. Recently, photonic integrated circuits have been formed in silicon. Such silicon-based photonic integrated circuits may be formed using traditional silicon fabrication techniques such as photolithography.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
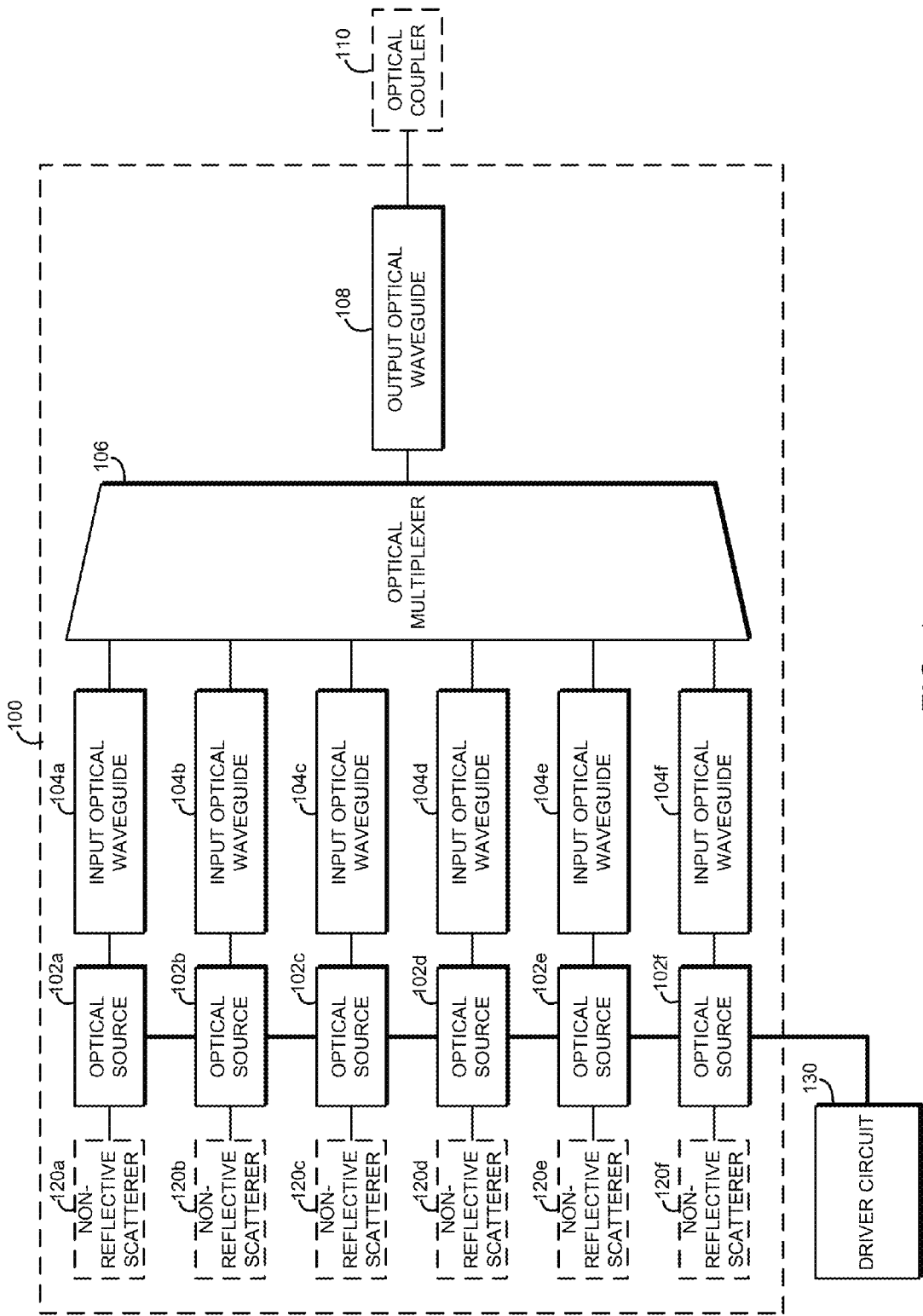
FIG. 1 is a simplified block diagram of at least one embodiment of a photonic integrated circuit having a broadband optical output.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, in an illustrative embodiment, a photonic integrated circuit 100 generates a broadband optical output by combining multiple, separate narrowband optical outputs generated by corresponding narrowband optical sources. The illustrative photonic integrated circuit 100 is embodied as a silicon-based photonic integrated circuit and includes a number of optical integrated components formed on or in a silicon-on-insulator substrate (SOI). Because the photonic integrated circuit 100 is silicon-based, standard semiconductor manufacturing techniques (e.g., photolithography) may be used to form the individual optical integrated components of the photonic integrated circuit 100. As such, the alignment of the individual optical integrated components is determined by the tolerances of the semiconductor manufacturing technique, not by mechanical packaging, allowing for a reduced overall size of the photonic integrated circuit 100. As discussed in more detail below, the broadband optical output generated by the photonic integrated circuit 100 can have a spectral bandwidth of up to 800 nanometers or more.

The illustrative photonic integrated circuit 100 includes two or more optical sources 102, two or more input optical waveguides 104, an optical multiplexer 106, and an output optical waveguide 108. For example, in the illustrative embodiment of FIG. 1, the photonic integrated circuit 100 includes six optical sources 102 (102a-102f) and six corresponding input optical waveguides 104 (104a-104f). Of course, the photonic integrated circuit 100 may include additional or fewer optical sources 102 and corresponding input optical waveguides 104 in other embodiments depending on, for example, the desired spectral bandwidth of the broadband optical output and size constraints of the photonic integrated circuit 100.

Each of the optical sources 102 are designed to generate a corresponding narrowband optical output in response to an excitation signal. In the illustrative embodiments described herein, each optical source 102 is embodied as a III-V compound gain element. That is, each optical source 102 is formed from ternary and quaternary compounds. For example, in the illustrative embodiment, each optical source 102 includes an Indium Phosphide (InP) substrate on which additional III-V compounds may be established using typical semiconductor manufacturing techniques (e.g., the additional III-V compounds may be grown on the InP substrate using a chemical vapor deposition technique). As discussed in more detail below, each optical source 102 is illustratively established on a top surface of the silicon-on-insulator substrate of the photonic integrated circuit 100 over a corresponding input optical waveguide 104 such that the narrowband optical output of each optical source is injected into the corresponding input optical waveguide 104 during excitation.

The particular combination of III-V compounds used to fabricate each optical source 102 is selected such that the narrowband optical output of each optical source 102 is different. For example, in the illustrative embodiment, each narrowband optical output has a different center frequency. Additionally, each narrowband optical output may have a similar or different spectral bandwidth (i.e., a 3 db spectral bandwidth). Although the output of the optical sources 102 are described herein as "narrowband" optical output, it should be appreciated that such designation is in relation to the broadband optical output of the photonic integrated circuit 100. In the illustrative embodiment, the optical sources 102 (e.g., the III-V compound gain elements) are configured to generate amplified spontaneous emission (ASE) optical output, which has a broader spectral bandwidth (although lower amplitude) relative to optical sources operating in a lasing mode. Illustratively, the optical sources 102 are configured for amplified spontaneous emission based on the fabrication of the III-V compounds on top of the silicon-on-insulator substrate.

In some embodiments, the photonic integrated circuit 100 may also include a non-reflective scatterer 120 (120a-120f) coupled to an input end of each input optical waveguide 104. The non-reflective scatterers 120 scatter the narrowband optical output received at the input end of each input optical waveguide 104 to ensure the narrowband optical output is not reflected back to the optical source 102, which could cause the optical source 102 to lase. In the illustrative embodiment, each of the non-reflective scatterers 120 is embodied as a taper formed at the input end of each input optical waveguide 104. In other embodiments, other mechanisms may be used to ensure, or otherwise reduce the likelihood, that the optical sources 102 do not lase. For example, in some embodiments, the non-reflective scatterers 120 may be replaced with optical absorbing elements. In still other embodiments, the non-reflective scatterers 120 may be omitted.

As discussed above, each optical source 102 is formed over a corresponding input optical waveguide 104 and injects its narrowband optical output into the corresponding input optical waveguide 104. Each input optical waveguide 104 routes the received narrowband optical output to the optical multiplexer 106 where it is combined with other narrowband optical outputs to generate the broadband optical output. The input optical waveguides 104 may be embodied as any type of optical waveguides capable of routing or directing an optical signal or output. In the illustrative embodiment, the input optical waveguides 104 are embodied as silicon rib optical waveguides, which may be formed by etching trenches on either side of the desired waveguide (e.g., etching to the buried oxide), by depositing or building the silicon waveguide upon a substrate, or via other manufacturing techniques. Due to the optical properties of silicon, an optical signal or output may be propagated through the silicon with low loss, similar to a fiber optic wire.

The optical multiplexer 106 receives the narrowband optical output routed by each input optical waveguide 104 and combines each narrowband optical output (or a portion of each narrowband optical output) to generate the broadband optical output at the output optical waveguide 108. In the illustrative embodiment, the optical multiplexer 106 is embodied as an echelle grating mirror configured to reflect a portion of each narrowband optical output to the output optical waveguide 108. The echelle grating mirror may be formed by etching the echelle grating mirror into the silicon-on-insulator substrate (e.g., etching to the buried oxide), by depositing or building the echelle grating mirror upon a substrate, or via other manufacturing techniques The echelle grating mirror includes an inner wall that acts similar to a mirror to reflect optical beams due to the properties of the silicon substrate.

The portions of the narrowband optical outputs reflected by the optical multiplexer 106 are received by the output optical waveguide 108. Because each of the narrowband optical outputs are reflected into the output optical waveguide 108, the individual narrowband optical outputs are combined to form the broadband optical output of the photonic integrated circuit 100. The output optical waveguide 108 routes the broadband optical output to an output of the photonic integrated circuit 100. For example, an optical coupler 110 may be coupled to the output optical waveguide to thereby couple fiber optic cable(s) to the photonic integrated circuit 100. In some embodiments, the optical coupler 110 may form a portion of the photonic integrated circuit 100.

Similar to the input optical waveguides 104, the output optical waveguide 108 is embodied as silicon rib optical waveguide in the illustrative embodiment. The output optical waveguide 108 may be formed using similar manufacturing techniques as used to form the input optical waveguides (e.g., by etching trenches on either side of the desired waveguide, by depositing or building the silicon waveguide upon a substrate, or via other manufacturing techniques). Again, due to the optical properties of silicon, the broadband optical output may be routed to the output of the photonic integrated circuit 100 with low loss.

Figure 2:
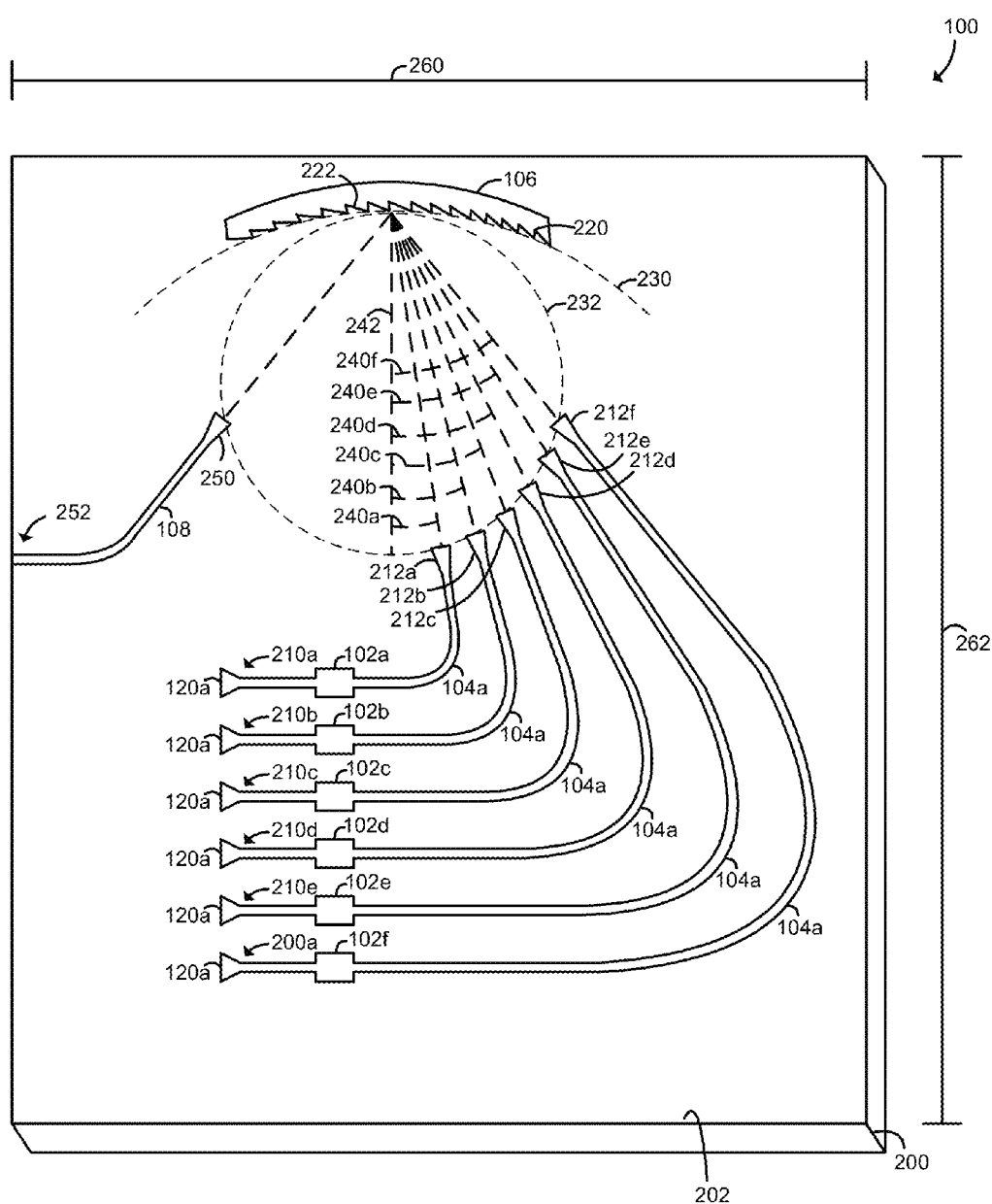
FIG. 2 is a simplified plan view of at least another embodiment of a photonic integrated circuit having a broadband optical output.
Figure 3:
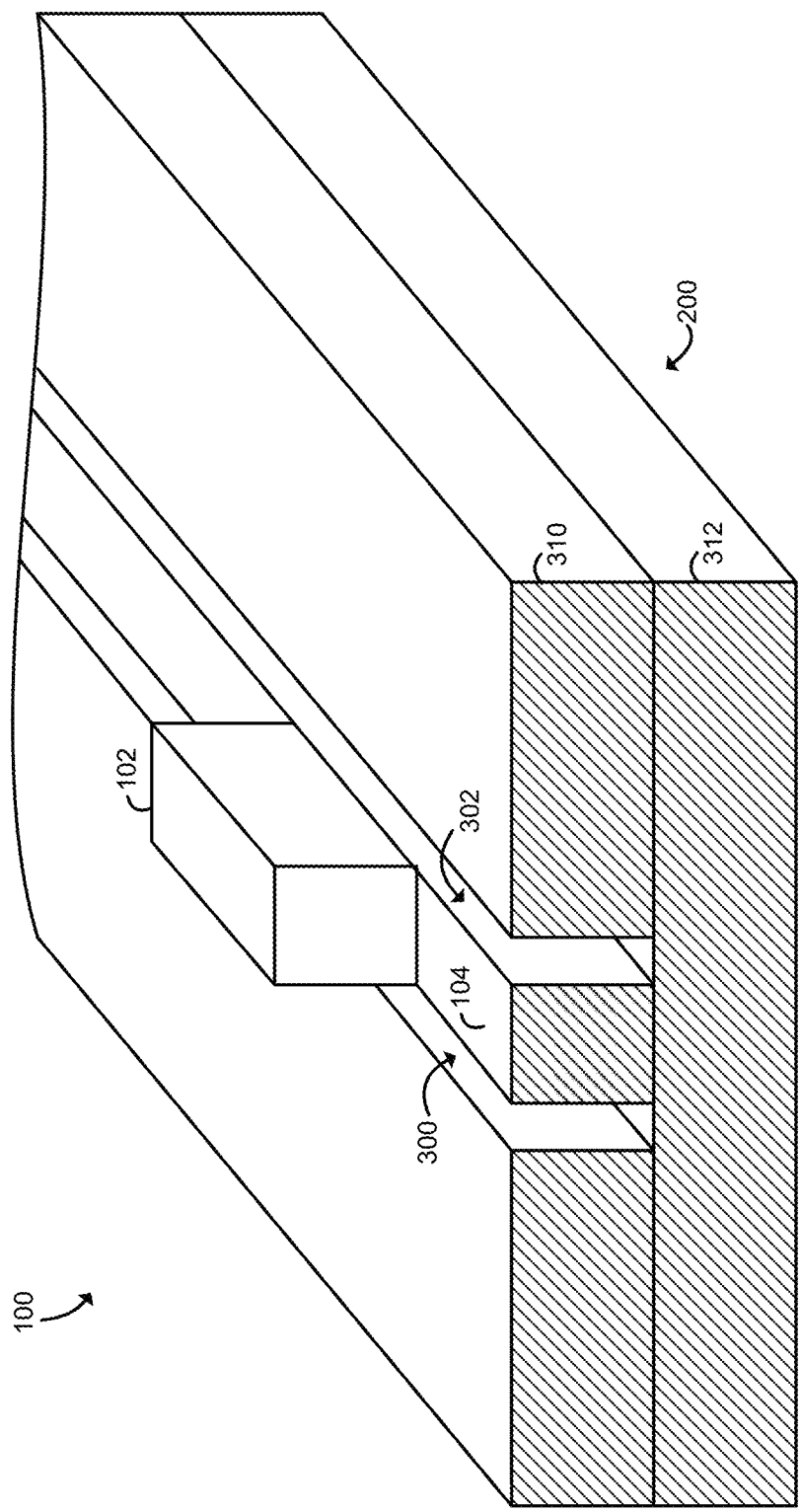
FIG. 3 is a simplified partial cross-section of the photonic integrated circuits of FIGS. 1 and 2 showing at least one embodiment of a silicon rib input optical waveguide and an associated III-V compound optical source.

Referring now to FIG. 2, in a particular embodiment, the photonic integrated circuit 100 includes a silicon-on-insulator (SOI) substrate 200 having a top surface 202 on which six optical sources 102 (102a-102f) are formed. In the illustrative embodiment of FIG. 2, each of the optical sources 102 are embodied as III-V compound gain elements configured to generate amplified spontaneous emission (ASE) optical outputs in response to an excitation signal. The photonic integrated circuit 100 of FIG. 2 also includes six input optical waveguides 104 (104*a*-104*f*) etched into the silicon layer of the SOI substrate 200, and each optical source 102 is established over a portion of a corresponding input optical waveguide 104. For example, as shown in FIG. 3, each of the input optical waveguides 104 (as well as the output optical waveguide 108) may be formed by etching trenches 300, 302 into a silicon layer 310 of the SOI substrate 200, which is formed on an insulator 312. The trenches 300, 302 may be etched completely through the silicon layer 310 as shown in FIG. 3 or etched only part way through silicon layer 310 in other embodiments. A corresponding III-V compound gain element optical source 102 is established over a portion of the input optical waveguide 104 to inject an optical output (i.e., an ASE optical output) into the associated input optical waveguide 104.

Although the substrate 200 has been described herein as a silicon-on-insulator (SOI) substrate having the silicon layer 310 formed on an insulator 312, the substrate 200 may be formed from other materials in other embodiments. For example, the layer 310 of the substrate 200 may be formed from a silicon compound or from materials other than silicon in other embodiments.

Referring back to FIG. 2, each input optical waveguide 102 includes an input end 210 (210*a*-210*f*) located on one side of the associated optical source 102 and an output end 212 (212*a*-212*f*) located on another side of the associated optical source 102. A non-reflective scatterer 120 (120*a*-120*f*) is formed at each input end 210 of each input optical waveguide 104. As discussed above, each of the non-reflective scatterers 120 is illustratively embodied as a tapered end of a corresponding input optical waveguide 104 and are configured to scatter the ASE optical output received at the input end 210. Similarly, each output end 212 is embodied as a taper and is formed in the SOI substrate such that each output end 212 is aimed or directed toward the optical multiplexer 106.

The optical multiplexer 106 of the photonic integrated circuit 100 of FIG. 2 is embodied as an echelle grating mirror etched into the silicon layer 310 of the SOI substrate 200. As show in FIG. 2, the illustrative echelle grating mirror 106 has a generally curved shape including a front inner wall 220 having a plurality of teeth 222. Each of the plurality of teeth 222 is angled toward the output optical waveguide 108 to reflect at least a portion of the ASE optical output received from the input optical waveguides 104. Illustratively, the echelle grating mirror 106 is designed to employ total internal reflection, but may not be so in other embodiments. Alternatively, the reflective property of the echelle grating mirror 106 can be determined by the interface at the inner wall 220, which also may be coated with a reflective material such as an metal coating. As shown in FIG. 2, the illustrative echelle grating mirror 106 is generally formed along an arc length of a circle 230 having a radius greater than the radius of a circle 232 on which the output ends 212 of each input optical waveguide is defined (commonly known as a Rowland circle). In some embodiments, the radius of the circle 230 is double the radius of the circle 232. Of course, in other embodiments, the optical multiplexer 106 may have other configurations and structures.

As discussed above, the echelle grating mirror 106 reflects at least a portion of the ASE optical output of each input optical waveguide 104 to the output optical waveguide 108 to generate the broadband optical output. To increase or maximize the reflected ASE optical output, the output end 212 of input optical waveguide 104 is positioned in the substrate 200 relative to the echelle grating mirror 106 such that the angle of incidence 240 (240*a*-240*f*) of each input optical waveguide 104, relative to a normal diameter 242 of the circle 232, is greater than the angle for total internal reflection of the echelle grating mirror 106. It should be appreciated that the space generally denoted by the circle 232 forms a silicon free space region in which the ASE optical output of each input optical waveguide 104 is not laterally bounded (unlike inside the respective input optical waveguide 104).

As discussed above, the output optical waveguide 108 is configured to receive the portions of the ASE optical output reflected by the echelle grating mirror 106. As shown in FIG. 2, the illustrative output optical waveguide 108 includes an input end 250 located on the circle 232 (similar to the output ends 212 of the input optical waveguides 104) and an output end 252. The input end 250 of the output optical waveguide 208 is embodied as a taper directed toward the echelle grating mirror 106 to receive the reflected ASE optical outputs, which is combined by the echelle grating mirror 106 to form the broadband optical output. The output optical waveguide 108 routes the broadband optical output to the output end 252, which may be coupled to an optic coupler or other device or interconnect to facilitate the use of the broadband optical output.

Again, it should be appreciated that the photonic integrated circuit 100 of FIG. 2 may be fabricated using typical semiconductor manufacturing techniques. As such, the photonic integrated circuit 100 may be established on an SOI substrate 200 having relatively small dimensions. For example, in the particular embodiment of FIG. 2, the photonic integrated circuit 100 is fabricated such that the SOI substrate 200 has a width 260 and a length 262 less than about two centimeters. Such dimensioning of the photonic integrated circuit 100 facilitates its use in a broad range of applications, especially those having size constraints.

Figure 4:
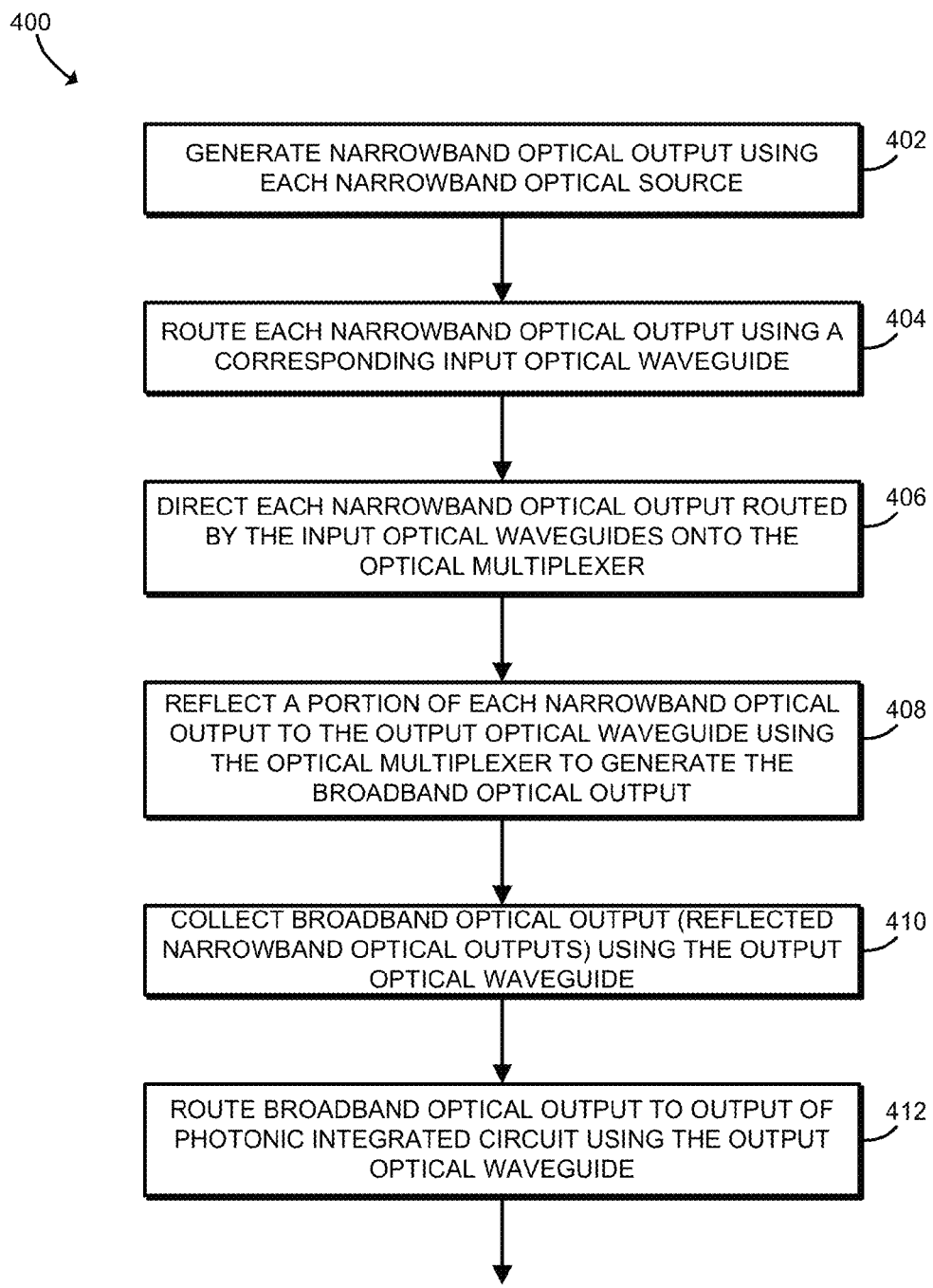
FIG. 4 is a simplified flow diagram of at least one embodiment of a method for generating a broadband optical output.

Referring now to FIG. 4, in an embodiment, the photonic integrated circuit 100 may perform a method 400 to generate a broadband optical output. The method 400 begins with block 402 in which each narrowband optical source 102 generates a narrowband optical output. As discussed above, in some embodiments, the narrowband optical sources 102 may be fabricated or otherwise configured to generate an ASE optical output. In block 404, each narrowband optical output is received by a corresponding input optical waveguide 104, which routes the received narrowband optical output within the photonic integrated circuit 100. In block 406, each input optical waveguide 104 directs its narrowband optical output to the optical multiplexer 106. The multiplexer 106 reflects at least a portion of each narrowband optical output to the output optical waveguide 108 to generate the broadband optical output. The output optical waveguide 108 collects the broadband optical output and routes the broadband optical output to the output of the photonic integrated circuit. In this way, a broadband optical output may be generated from a silicon-based photonic integrated circuit 100.

Figure 5:
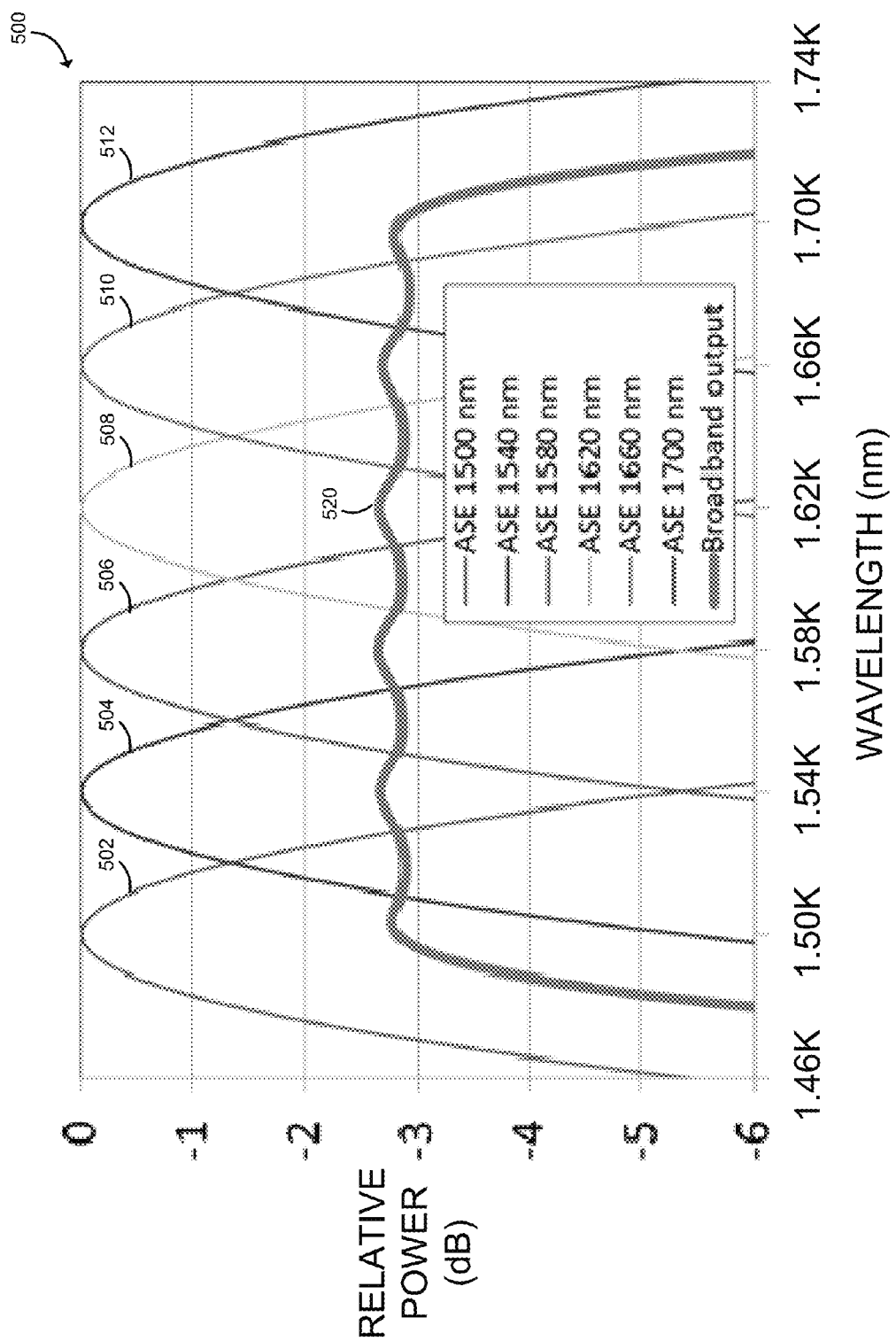
FIG. 5 is a simplified graph illustrating simulated results of the method of FIG. 4.

Referring now to FIG. 5, a graph 500 illustrates simulated results generated by an illustrative embodiment of the photonic integrated circuits 100 of FIGS. 1 and 2. In the illustrative embodiment of FIG. 5, the photonic integrated circuit 100 includes six optical sources 102 configured to generate narrowband optical outputs having different center frequencies. In particular, the optical sources 102 are configured to generate a first optical output 502 having a center frequency of about 1,500 nanometers and spectral bandwidth of about 60 nanometers (i.e., the 3 dB spectral bandwidth), a second optical output 504 having a center frequency of about 1,540 nanometers and spectral bandwidth of about 60 nanometers, a third optical output 506 having a center frequency of about 1,580 nanometers and spectral bandwidth of about 60 nanometers, a fourth optical output 508 having a center frequency of about 1,620 nanometers and spectral bandwidth of about 60 nanometers, a fifth optical output 510 having a center frequency of about 1,660 nanometers and spectral bandwidth of about 60 nanometers, and a sixth optical output 512 having a center frequency of about 1,700 nanometers and spectral bandwidth of about 60 nanometers. As also shown in the graph 500, the resulting broadband optical output 520 of the photonic integrated circuit 100 has a spectral bandwidth of about 200 nanometers, ranging from about 1,500 nanometers to about 1,700 nanometers. Additionally, as shown, the simulated broadband optical output 520 has a ripple of less than 0.2 dB, with less than 3 dB of optical loss.

Of course, it should be appreciated that the simulated results of FIG. 5 were generated based on the illustrative design and configuration of the photonic integrated circuit 100 according to the details described above in regard to FIG. 5. Furthermore, it should be appreciated that the technologies and techniques described herein may be used to construct a photonic integrated circuit 100 capable of generating a broadband optical output with up to 800 nanometer spectral bandwidth depending on the III-V compound materials used. That is, the broadband optical output of the photonic integrated circuit of FIGS. 1 and 2 is generally limited only by the narrowband gain elements that can be bonded to the silicon-on-insulator input optical waveguides. As such, narrowband gain elements improve, narrowband gain elements generating narrowband optical outputs from 1250 nanometers to greater than 2,000 nanometers may be used in the photonic integrated circuit 100 to generate broadband optical outputs having a spectral bandwidth of greater than 800 nanometers.

EXAMPLES

Illustrative examples of the technologies disclosed herein are provided below. An embodiment of the technologies may include any one or more, and any combination of, the examples described below.

Example 1 includes a photonic integrated circuit for generating a broadband optical output, the photonic integrated circuit comprising a silicon substrate; a plurality of narrowband optical sources, each narrowband optical source to generate a narrowband optical output in response to an excitation signal; a plurality of input optical waveguides, wherein each input optical waveguide is formed in the silicon substrate to receive the narrowband optical output from a corresponding narrowband optical source; an optical multiplexer formed in the silicon substrate; and an output optical waveguide formed in the silicon substrate, wherein (i) each of the plurality of input optical waveguides directs the narrowband optical output received from the corresponding narrowband optical source to the optical multiplexer and (ii) the optical multiplexer directs at least a portion of each narrowband optical output to the output optical waveguide to generate the broadband optical output.

Example 2 includes the subject matter of Example 1, and wherein the silicon substrate is a silicon-on-insulator substrate.

Example 3 includes the subject matter of any of Examples 1 and 2, and wherein the plurality of narrowband optical sources comprises a plurality of III-V compound optical gain elements formed on a top surface of the silicon substrate.

Example 4 includes the subject matter of any of Examples 1-3, and wherein each of the plurality of III-V compound optical gain elements comprises an indium phosphide substrate.

Example 5 includes the subject matter of any of Examples 1-4, and wherein each of the plurality of narrowband optical sources is to generate an amplified spontaneous emission in response to an excitation signal.

Example 6 includes the subject matter of any of Examples 1-5, and wherein each narrowband optical output has a different center frequency and a spectral bandwidth of about 60 nanometers.

Example 7 includes the subject matter of any of Examples 1-6, and wherein the plurality of narrowband optical sources comprises a first narrowband optical source to generate, in response to the excitation signal, a first narrowband optical output having a center frequency of about 1,500 nanometers; a second narrowband optical source to generate, in response to the excitation signal, a second narrowband optical output having a center frequency of about 1,540 nanometers; a third narrowband optical source to generate, in response to the excitation signal, a third narrowband optical output having a center frequency of about 1,580 nanometers; a fourth narrowband optical source to generate, in response to the excitation signal, a fourth narrowband optical output having a center frequency of about 1,620 nanometers; a fifth narrowband optical source to generate, in response to the excitation signal, a fifth narrowband optical output having a center frequency of about 1,660 nanometers; and a sixth narrowband optical source to generate, in response to the excitation signal, a sixth narrowband optical output having a center frequency of about 1,700 nanometers.

Example 8 includes the subject matter of any of Examples 1-7, and wherein each input optical waveguide is a silicon-on-insulator rib input optical waveguide.

Example 9 includes the subject matter of any of Examples 1-8, and wherein each input optical waveguide comprises an output end directed toward the optical multiplexer, and the output end of each input optical waveguide has a taper.

Example 10 includes the subject matter of any of Examples 1-9, and wherein each input optical waveguide further comprises an input end located on an opposite side of the corresponding narrowband optical source relative to the output end, and wherein the photonic integrated circuit further comprises a non-reflective scatterer located at the input end of each input optical waveguide.

Example 11 includes the subject matter of any of Examples 1-10, and wherein the optical multiplexer comprises an echelle grating mirror formed in the silicon substrate.

Example 12 includes the subject matter of any of Examples 1-11, and wherein the echelle grating mirror includes a reflective coating applied to an inner wall of the echelle grating mirror.

Example 13 includes the subject matter of any of Examples 1-12, and wherein each input optical waveguide comprises an output end directed toward the echelle grating mirror and wherein the output end of each input optical waveguide is positioned relative to the echelle grating mirror such that an angle of incident of each input optical waveguide to the echelle grating mirror is greater than the angle for total internal reflection of the echelle grating mirror.

Example 14 includes the subject matter of any of Examples 1-13, and wherein the output optical waveguide comprises an input end having a taper to receive the portion of each narrowband optical output of the plurality of input optical waveguides.

Example 15 includes the subject matter of any of Examples 1-14, and further including a driver circuit electrically coupled to each narrowband optical source, the driver circuit to generate the excitation signal.

Example 16 includes the subject matter of any of Examples 1-15, and wherein the broadband optical output has a spectral bandwidth of at least 200 nanometers.

Example 17 includes the subject matter of any of Examples 1-16, and wherein the broadband optical output has a spectral bandwidth between 200 nanometers and 800 nanometers.

Example 18 includes the subject matter of any of Examples 1-17, and wherein the broadband optical output has a spectral bandwidth ranging from about 1,500 nanometers to about 1,700 nanometers.

Example 19 includes the subject matter of any of Examples 1-18, and wherein the silicon substrate has a largest dimension that is less than two centimeters.

Example 20 includes a silicon-based photonic integrated circuit for generating a broadband optical output, the photonic integrated circuit comprising a silicon-on-insulator substrate; an echelle grating mirror formed in the silicon-on-insulator substrate; a plurality of III-V compound optical gain elements formed on a top surface of the silicon-on-insulator substrate, each III-V compound optical gain element to generate an amplified spontaneous emission optical output in response to an excitation signal; a plurality of input optical waveguides formed in the silicon-on-insulator substrate, wherein (i) a portion of each input optical waveguide is formed below a corresponding gain element of the plurality of III-V compound optical gain elements to receive the amplified spontaneous emission optical output generated by the corresponding gain element and (ii) each input optical waveguide includes a tapered output end directed toward the echelle grating mirror to direct the amplified spontaneous emission optical output onto the echelle grating mirror; and an output optical waveguide formed in the silicon substrate, wherein the output optical waveguide includes an input end having a taper to receive at least a portion of each amplified spontaneous emission optical output reflected by the echelle grating mirror to generate the broadband optical output.

Example 21 includes the subject matter of Example 20, and wherein each of the plurality of III-V compound optical gain elements comprises an indium phosphide substrate.

Example 22 includes the subject matter of any of Examples 20 and 21, and wherein each amplified spontaneous emission optical output has a different center frequency and a spectral bandwidth of about 60 nanometers.

Example 23 includes the subject matter of any of Examples 20-22, and wherein the plurality of III-V compound optical gain elements comprises a first III-V compound optical gain element to generate, in response to the excitation signal, a first amplified spontaneous emission optical having a center frequency of about 1,500 nanometers; a second III-V compound optical gain element to generate, in response to the excitation signal, a second amplified spontaneous emission optical having a center frequency of about 1,540 nanometers; a third III-V compound optical gain element to generate, in response to the excitation signal, a third amplified spontaneous emission optical having a center frequency of about 1,580 nanometers; a fourth III-V compound optical gain element to generate, in response to the excitation signal, a fourth amplified spontaneous emission optical having a center frequency of about 1,620 nanometers; a fifth III-V compound optical gain element to generate, in response to the excitation signal, a fifth amplified spontaneous emission optical having a center frequency of about 1,660 nanometers; and a sixth III-V compound optical gain element to generate, in response to the excitation signal, a sixth amplified spontaneous emission optical having a center frequency of about 1,700 nanometers.

Example 24 includes the subject matter of any of Examples 20-23, and wherein each input optical waveguide is a silicon-on-insulator rib input optical waveguide.

Example 25 includes the subject matter of any of Examples 20-24, and wherein each input optical waveguide further comprises an input end located on an opposite side of the corresponding III-V compound optical gain element relative to the tapered output end, and wherein the silicon-based photonic integrated circuit further comprises a non-reflective scatterer located at the input end of each input optical waveguide.

Example 26 includes the subject matter of any of Examples 20-25, and wherein the echelle grating mirror includes a reflective coating applied to an inner wall of the echelle grating mirror.

Example 27 includes the subject matter of any of Examples 20-26, and wherein the output end of each input optical waveguide is positioned relative to the echelle grating mirror such that an angle of incident of each input optical waveguide to the echelle grating mirror is greater than the angle for total internal reflection of the echelle grating mirror.

Example 28 includes the subject matter of any of Examples 20-27, and further including a driver circuit electrically coupled to each III-V compound optical gain element, the driver circuit to generate the excitation signal.

Example 29 includes the subject matter of any of Examples 20-28, and wherein the broadband optical output has a spectral bandwidth of at least 200 nanometers.

Example 30 includes the subject matter of any of Examples 20-29, and wherein the broadband optical output has a spectral bandwidth between 200 nanometers and 800 nanometers.

Example 31 includes the subject matter of any of Examples 20-30, and wherein the broadband optical output has a spectral bandwidth ranging from about 1,500 nanometers to about 1,700 nanometers.

Example 32 includes the subject matter of any of Examples 20-31, and wherein the silicon-on-insulator substrate has a largest dimension that is less than two centimeters.

Example 33 includes a method for generating a broadband optical output from a photonic integrated circuit, the method comprising generating a narrowband optical output from each of a plurality of narrowband optical sources of the photonic integrated circuit; routing the narrowband optical output generated by each of the plurality of narrowband optical sources through a corresponding input optical waveguide of the photonic integrated circuit; directing the narrowband optical output routed by each input optical waveguide onto an optical multiplexer of the photonic integrated circuit; reflecting, by the optical multiplexer, at least a portion of each narrowband optical output to an output optical waveguide of the photonic integrated circuit; and collecting, by the output optical waveguide, the portion of each narrowband optical output reflected by the optical multiplexer to generate the broadband optical output.

Example 34 includes the subject matter of Example 33, and wherein generating the narrowband optical output comprises generating an amplified spontaneous emission optical output from each of a III-V compound optical gain element.

Example 35 includes the subject matter of any of Examples 33 and 34, and wherein generating the narrowband optical output comprises generating a plurality of narrowband optical outputs wherein each narrowband optical output has a different center frequency and a spectral bandwidth of about 60 nanometers.

Example 36 includes the subject matter of any of Examples 33-35, and wherein generating the narrowband optical output in response to an excitation signal received by each narrowband optical source.

Example 37 includes the subject matter of any of Examples 33-36, and wherein routing the narrowband optical output comprises routing the narrowband optical output generated by each of the plurality of narrowband optical sources through a corresponding silicon-on-insulator rib input optical waveguide of the photonic integrated circuit Example 38 includes the subject matter of any of Examples 33-37, and wherein reflecting the at least a portion of each narrowband optical output comprises reflecting, by an echelle grating mirror, at least a portion at least a portion of each narrowband optical output.

Example 39 includes the subject matter of any of Examples 33-38, and wherein collecting the portion of each narrowband optical output comprises collecting the portion of each narrowband optical output reflected by the optical multiplexer to generate a broadband optical output having a spectral bandwidth of at least 200 nanometers.

Example 40 includes the subject matter of any of Examples 33-39, and wherein collecting the portion of each narrowband optical output comprises collecting the portion of each narrowband optical output reflected by the optical multiplexer to generate a broadband optical output having a spectral bandwidth of between 200 nanometers and 800 nanometers.

Example 41 includes the subject matter of any of Examples 33-40, and wherein collecting the portion of each narrowband optical output comprises collecting the portion of each narrowband optical output reflected by the optical multiplexer to generate a broadband optical output having a spectral bandwidth ranging from about 1,500 nanometers to about 1,700 nanometers.

The invention claimed is:

1. A photonic integrated circuit for generating a broadband optical output, the photonic integrated circuit comprising:
   a silicon substrate;
   an optical multiplexer formed in the silicon substrate;
   a plurality of narrowband optical sources, each narrowband optical source to generate a narrowband optical output in response to an excitation signal;
   a plurality of input optical waveguides, wherein each input optical waveguide is formed in the silicon substrate to receive the narrowband optical output from a corresponding narrowband optical source and comprises an output end directed toward the optical multiplexer and an input end located on an opposite side of the corresponding narrowband optical source relative to the output end;
   an output optical waveguide formed in the silicon substrate; and
   a non-reflective scatterer located at the input end of each input optical waveguide,
   wherein (i) each of the plurality of input optical waveguides directs the narrowband optical output received from the corresponding narrowband optical source to the optical multiplexer and (ii) the optical multiplexer directs at least a portion of each narrowband optical output to the output optical waveguide to generate the broadband optical output.

2. The photonic integrated circuit of claim 1, wherein the silicon substrate is a silicon-on-insulator substrate.

3. The photonic integrated circuit of claim 1, wherein the plurality of narrowband optical sources comprises a plurality of III-V compound optical gain elements formed on a top surface of the silicon substrate.

4. The photonic integrated circuit of claim 3, wherein each of the plurality of III-V compound optical gain elements comprises an indium phosphide substrate.

5. The photonic integrated circuit of claim 1, wherein to generate a narrowband optical output comprises to generate an amplified spontaneous emission in response to an excitation signal.

6. The photonic integrated circuit of claim 1, wherein each input optical waveguide is a silicon-on-insulator rib input optical waveguide.

7. The photonic integrated circuit of claim 1, wherein the output end of each input optical waveguide has a taper.

8. The photonic integrated circuit of claim 1, wherein the optical multiplexer comprises an echelle grating mirror formed in the silicon substrate.

9. The photonic integrated circuit of claim 8, wherein the echelle grating mirror includes a reflective coating applied to an inner wall of the echelle grating mirror.

10. The photonic integrated circuit of claim 8, wherein each input optical waveguide comprises an output end directed toward the echelle grating mirror and wherein the output end of each input optical waveguide is positioned relative to the echelle grating mirror such that an angle of incident of each input optical waveguide to the echelle grating mirror is greater than the angle for total internal reflection of the echelle grating mirror.

11. The photonic integrated circuit of claim 1, wherein the output optical waveguide comprises an input end having a taper to receive the portion of each narrowband optical output of the plurality of input optical waveguides.

12. The photonic integrated circuit of claim 1, further comprising a driver circuit electrically coupled to each narrowband optical source, the driver circuit to generate the excitation signal.

13. The photonic integrated circuit of claim 1, wherein the broadband optical output has a spectral bandwidth of at least 200 nanometers.

14. The photonic integrated circuit of claim 1, wherein the silicon substrate has a largest dimension that is less than two centimeters.

15. A method for generating a broadband optical output from a photonic integrated circuit, the method comprising:
   generating a narrowband optical output from each of a plurality of narrowband optical sources of the photonic integrated circuit;
   routing the narrowband optical output generated by each of the plurality of narrowband optical sources through a corresponding input optical waveguide of the photonic integrated circuit;
   directing the narrowband optical output routed by each input optical waveguide from an output end of the corresponding input optical waveguide onto an optical multiplexer of the photonic integrated circuit;
   reflecting, by the optical multiplexer, at least a portion of each narrowband optical output to an output optical waveguide of the photonic integrated circuit; and collecting, by the output optical waveguide, the portion of each narrowband optical output reflected by the optical multiplexer to generate the broadband optical output, wherein each input optical waveguide comprises an input end located on an opposite side of the corresponding narrowband optical source relative to the output end and wherein the photonic integrated circuit further comprises a non-reflective scatterer located at the input end of each input optical waveguide.

16. The method of claim 15, wherein generating the narrowband optical output comprises generating an amplified spontaneous emission optical output from each of a III-V compound optical gain element.

17. The method of claim 15, wherein reflecting the at least a portion of each narrowband optical output comprises reflecting, by an echelle grating mirror, at least a portion at least a portion of each narrowband optical output.

* * * * *